(12) United States Patent
Yu et al.

(10) Patent No.: US 8,338,945 B2
(45) Date of Patent: Dec. 25, 2012

(54) MOLDED CHIP INTERPOSER STRUCTURE AND METHODS

(75) Inventors: Chen-Hua Yu, Hsin-Chu (TW); Chun Hui Yu, Zhubei (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 214 days.

(21) Appl. No.: 12/953,130

(22) Filed: Nov. 23, 2010

(65) Prior Publication Data

US 2012/0098123 A1  Apr. 26, 2012

Related U.S. Application Data

(60) Provisional application No. 61/406,914, filed on Oct. 26, 2010.

(51) Int. Cl.
*H01L 23/48* (2006.01)
(52) U.S. Cl. ........ 257/737; 257/778; 257/783; 438/108; 438/126
(58) Field of Classification Search .................. 257/737, 257/778, 793; 438/108, 126
See application file for complete search history.

(56) References Cited

U.S. PATENT DOCUMENTS

| | | | |
|---|---|---|---|
| 4,811,082 A | 3/1989 | Jacobs et al. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,908,565 B2 | 6/2005 | Kim et al. | |
| 6,908,785 B2 | 6/2005 | Kim | |

(Continued)

OTHER PUBLICATIONS

Keser, B. et al., "The Redistributed Chip Package: A Breakthrough for Advanced Packaging," 2007 Electronic Components and Technology Conference, IEEE, pp. 286-291.

(Continued)

*Primary Examiner* — Trung Q Dang
(74) *Attorney, Agent, or Firm* — Slater & Matsil, L.L.P.

(57) ABSTRACT

Apparatus and methods for providing a molded chip interposer structure and assembly. A molded chip structure having at least two integrated circuit dies disposed within a mold compound is provided having the die bond pads on the bottom surface; and solder bumps are formed in the openings of a dielectric layer on the bottom surface, the solder bumps forming connections to the bond pads. An interposer having a die side surface and a board side surface is provided having bump lands receiving the solder bumps of the molded chip structure on the die side of the interposer. An underfill layer is formed between the die side of the interposer and the bottom surface of the molded chip structure surrounding the solder bumps. Methods for forming the molded chip interposer structure are disclosed.

17 Claims, 5 Drawing Sheets

U.S. PATENT DOCUMENTS

| | | |
|---|---|---|
| 6,943,067 B2 | 9/2005 | Greenlaw |
| 7,087,538 B2 | 8/2006 | Staines et al. |
| 7,151,009 B2 | 12/2006 | Kim et al. |
| 7,215,033 B2 | 5/2007 | Lee et al. |
| 7,276,783 B2 | 10/2007 | Goller et al. |
| 7,276,799 B2 | 10/2007 | Lee et al. |
| 7,279,795 B2 | 10/2007 | Periaman et al. |
| 7,317,256 B2 | 1/2008 | Williams et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,576,435 B2 | 8/2009 | Chao |
| 7,834,450 B2 | 11/2010 | Kang |
| 2009/0170241 A1* | 7/2009 | Shim et al. .......... 438/107 |
| 2009/0294938 A1* | 12/2009 | Chen .................. 257/676 |
| 2010/0244277 A1* | 9/2010 | Huang et al. ......... 257/778 |
| 2011/0031619 A1* | 2/2011 | Chen et al. ........... 257/738 |

OTHER PUBLICATIONS

Yoon, S. W. et al., "3D eWLB (embedded wafer level BGA) Technology for 3D-Packaging/3D-SiP (Systems-in-Package) Applications," 2009 11$^{th}$ Electronics Packaging Technology Conference, IEEE, pp. 915-919.

* cited by examiner

MOLDED CHIP INTERPOSER STRUCTURE AND METHODS

This application claims the benefit of U.S. Provisional Application No. 61/406,914, entitled "Molded Chip Interposer Structure and Methods," filed on Oct. 26, 2010, which is incorporated herein by reference.

BACKGROUND

A current common requirement for an advanced electronic circuit and particularly for circuits manufactured as integrated circuits ("ICs") in semiconductor processes is the use of multiple integrated circuit devices ("dies") in a single packaged component. Typical arrangements include so-called "flip chip" packages where integrated circuit dies are mounted to an interposer using solder bumps or solder columns. The solder bumps may include lead based or more recently lead free materials such as eutectics. Once the dies are mounted onto the interposer a thermal reflow step is often performed to complete the mechanical and electrical connection to the die side surface of the interposer by melting the solder balls or bumps to cause them to bond to the pads on the die side of the interposer, and then allowing them to cool, or reflow. The resulting solder connection is a mechanical attachment and an electrical connection between the bond pads on the integrated circuit, which are coupled to devices within the integrated circuit, and the redistribution layer ("RDL) or conductors within the interposer. Often the opposing side of the interposer will receive solder balls, which are larger than but similar to the solder bumps, to form a "ball grid array" or BGA package. As the number and complexity of the dies mounted in such a package increase, the multi-chip package now sometimes replaces what was a board or system, and the completed device may be referred to as a "SoC", or "system on a chip".

Applications for such multiple chip packages are numerous. Because certain types of dedicated devices are commonly used, it is often needed to put these devices together to complete a functional design for a particular use. Combining microprocessor devices with program memory storage such as FLASH or EEPROM devices, combining microprocessors with application specific processors such as baseband transceivers, graphics processors, cache memory devices, memory management devices, and analog to digital converters for sensor applications, are all useful and commonly used arrangements that provide applications for the structures described herein.

After the dies are mounted to the interposer, an underfill material is typically dispensed around and underneath the dies. This underfill provides a stress relief, and in particular provides thermal stress relief for the solder balls. Since there is a thermal mismatch between the integrated circuit devices and the interposer the solder balls can be damaged by the physical stresses that occur due to the thermal expansion of the devices while in operation. The underfill provides a flexible compliant material surrounding the solder balls and between the dies and the surface of the interposer, and helps prevent solder ball failures dues to these stresses, or even die cracking that might otherwise occur.

In some arrangements, a mold compound structure is formed over the dies after the underfill is formed. The underfill "fillet", which is the area of underfill material that forms at the die edge and extends outside the die footprint and has an outside surface that slopes up to the die bottom surface, is then encapsulated in mold compound material. If there are voids in the mold compound or the two materials are not completely continuous, then additional areas for possible thermal stress problems are formed at the interface of these materials.

Dispensing the underfill in a prior art package using flip chip devices is difficult. The space between the dies is particularly hard to fill with an underfill dispensed after the bare dies are mounted to the interposer. Often voids remain, particularly in the spaced between the dies. These voids may lead to failures later and must be avoided.

A continuing need for interposer based packages and methods for multiple chip packages for flip chip integrated circuits that reduce or eliminate the problems associated with the prior art assemblies and methods thus exists.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus to provide multiple chip integrated circuit packages free of voids in the underfill used between the integrated circuit dies and the interposer. A molded chip, or in some embodiments, multiple chip structure is formed prior to forming the solder bump interposer connections to the flip chip integrated circuit dies. The molded chip structure provides a unitary surface that is coplanar with the integrated circuit surfaces. The mold compound surrounds the chips and thus reduces or eliminates the voids and incomplete fill problems associated with the use of underfill in the prior art arrangements. The areas between the integrated circuit dies are now filled with solid material prior to the solder bumping process, and when mounted on the interposer no underfill needs to be dispensed to fill these portions. The areas beneath the molded chip structure, between the dies and the interposer surfaces that are to be filled with underfill, are of uniform thickness and this makes filling these areas easier and eliminates voids in the completed underfill layer. The underfill fillet is formed outside the mold compound and so no voids or thermal failure problems are caused due to mold compound interfacing with underfill material, as in prior art arrangements.

Figure 1:
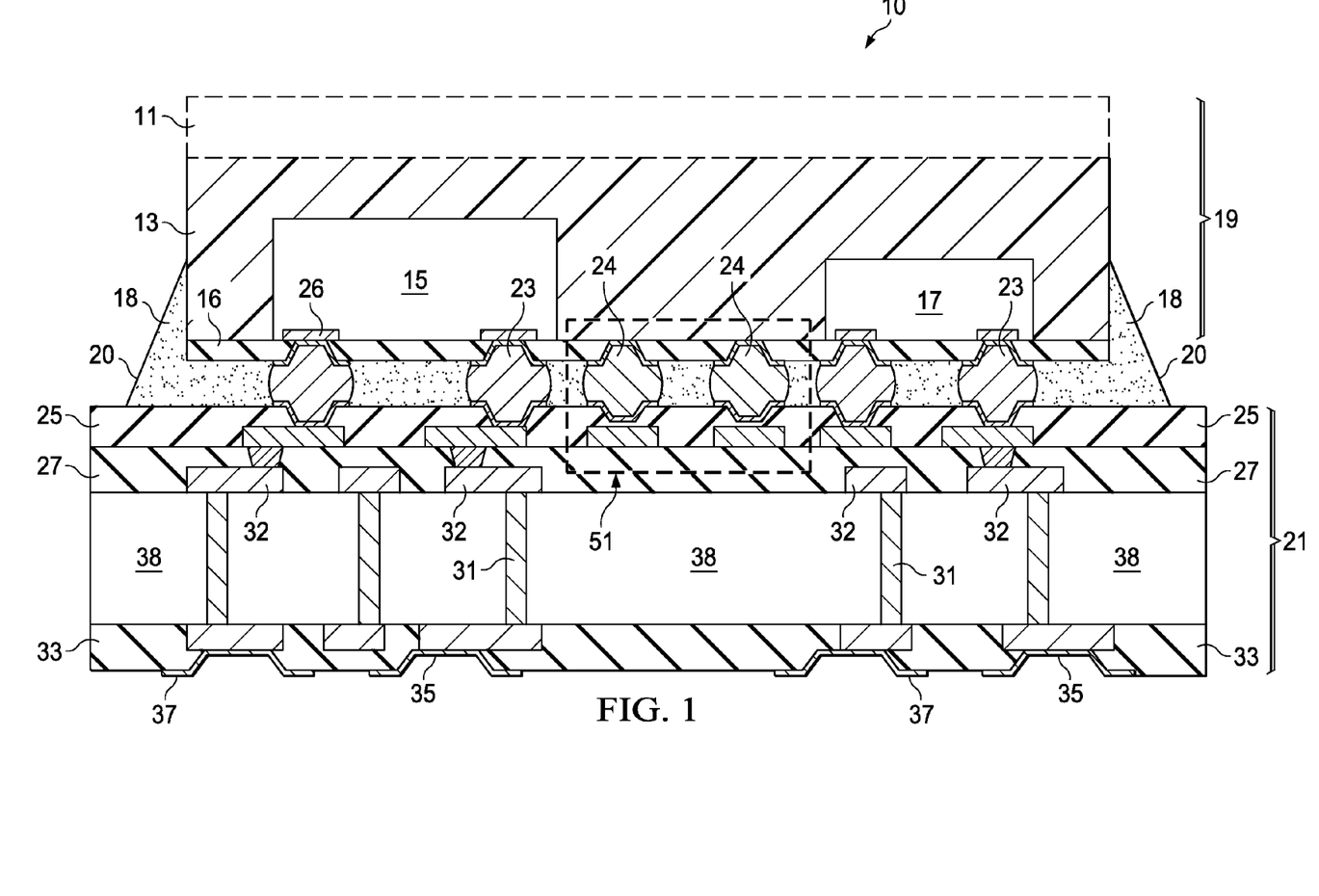
FIG. 1 depicts in a cross section a molded chip interposer assembly of an embodiment.

FIG. 1 depicts in a cross sectional view an example embodiment of a completed molded chip interposer structure 10 having two integrated circuit dies 15, 17 in a molded chip structure 19 mounted to an interposer 21. Each die has electrical connection terminals 26 which are conductive pads typically referred to as "bond pads". These bond pads are connected electrically through conductors in the integrated circuit dies to passive or active devices, such as resistors and transistors, formed within the dies (not visible). The bond pads form the external input output, power and clock signal terminals on the dies. Typically the dies may be already tested and proven functional, that is dies 15 and 17 may be "known good dies" or "KGDs". This increases the reliability of the finished devices and reduces cost by not processing untested dies that may not pass functional tests later. A molded multi-chip structure 19 is provided. This structure 19 includes an optional support layer 11, a mold material layer 13 which may alternatively be a mold compound such as the plastic mold compounds used for IC packaging which are epoxy resins, other resins or other epoxy materials, or silicone rubber. Mold material layer 13 may be of various thicknesses and may range from 10 microns to 200 microns; for example. Mold material layer 13 is formed laying over and surrounding and protecting the upper surface and sides of dies 15 and 17. A dielectric layer 16 which may be a passivation material or another dielectric material lies over the bond pad sides of the dies and the bottom of the mold layer 13, and an underfill layer 18 is dispensed between the molded multichip structure 19 and the interposer 21. The underfill is also disposed surrounding the solder balls 23. The underfill material may be an epoxy resin and may have a thickness range from 10 microns to 100 microns, for example. The underfill material also forms a fillet 20 at each edge of the molded multi chip structure 19, the fillet is formed outside of the mold compound and after the mold compound is cured.

The molded chip structure 19 forms a multiple chip module without the need for a separate interposer or redistribution layer ("RDL") thus forming a module that has fewer parts, and thus lower cost and fewer failure sites, than some prior art arrangements.

Interposer 21 is, in one embodiment, a silicon based interposer, although other interposer materials such as printed circuit board materials, ceramic, glass, plastic and resin and epoxy materials may also be used, including circuit board materials such as bismaleinide-triazine ("BT") resin. Interposer 21 includes a passivation layer 25. an upper redistribution layer (RDL) 27 including a dielectric material and patterned conductors 32, silicon layer 38, through silicon vias (TSVs) or other through hole vias 31, and a lower RDL 33. The lower or board side redistribution layer has ball lands 35 that may include another under bump metallization (UBM) layer 37.

In FIG. 1 lead based or lead free solder bumps 23 are shown electrically and mechanically coupling the molded chip structure 19 to the die side of the interposer 21. In an application such as for a ball grid array (BGA) package, larger solder balls, which are either lead based or lead free solder material, would be disposed on the solder ball lands 35 that are also covered with UBM layer 37, on the board side (bottom as seem in FIG. 1) of the interposer.

In FIG. 1, an optional dummy solder bump structure 51 is depicted. In this embodiment two dummy solder bumps 24 are shown, although more or less could be used. This solder bump structure, which is formed between dies 15 and 17 in this illustrative embodiment, may be provided to further improve the underfill deposition and uniformity by increasing the uniformity of the solder bump density. The solder bumps inside dummy structure 51 have no electrical connection to the dies and are not electrically functional, but are a mechanical feature. As is known in the art, when areas of very low density of solder bumps are included in an area to be filled with underfill material, dispensing the underfill material in a uniform fashion is more difficult, as the underfill material flows into those areas is at a different rate than in areas where the solder bump density is higher. In FIG. 1 the dummy solder bump structure 51 is added to improve solder bump density uniformity, and thus improve the uniformity of the underfill layer 18. However in other embodiments the dummy bump structure 51 and the corresponding solder bumps, conductors and UBM layers may be omitted.

Figure 2:
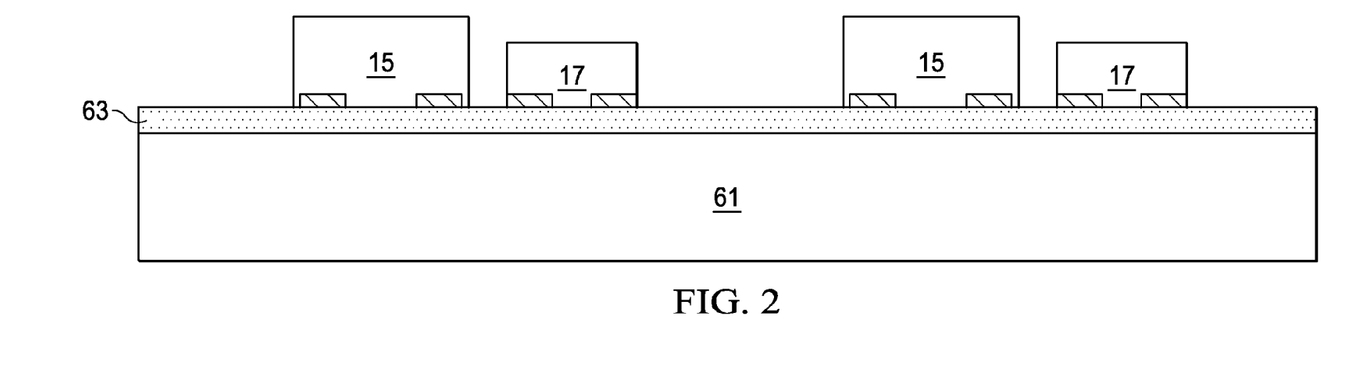
FIG. 2 depicts in a cross-section an assembly for use at an intermediate stage of processing of a molded chip structure for an embodiment.

FIG. 2 depicts in a cross sectional view an intermediate structure provided for illustrating the methods of forming the molded chip structures of the embodiments. In FIG. 2, four dies 15, and 17, two each of two different types, are depicted arranged in a multiple chip structure. The dies 15, 17 are adhered to a temporary carrier 61 by an adhesive layer 63. The adhesive layer 63 is temporary and any strippable or easily removed material may be used, for example films, tapes, liquid adhesives and the like. The temporary carrier may be of many different materials including silicon, ceramics, metals, and the like. If a thermoset mold compound is to be used for forming the mold layer 13, then the layer 63 and the temporary carrier 61 should be of materials that are compatible with the thermal conditions of plastic mold compound transfer tools.

Figure 3:
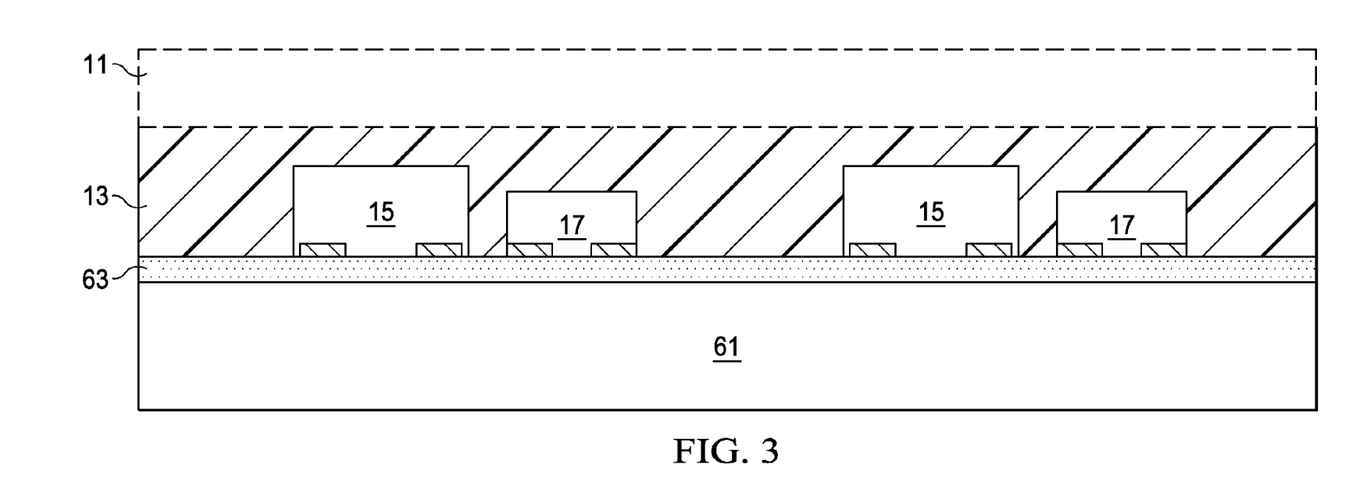
FIG. 3 depicts a cross section of the assembly of FIG. 2 following additional processing steps.

FIG. 3 depicts the cross sectional view of the structure of FIG. 2 following additional processing steps. Mold compound layer 13 is applied and forms covering the dies 15 and 17 on the sides and top surfaces, while the bottom or bond pad side surfaces remain covered by adhesive layer 63. Optionally, a support layer 11 may be formed over the mold compound 13. Mold compound 13 may be formed using thermoset mold compounds in a transfer mold press, for example. Other means of dispensing the mold compound may be used. Epoxies, resins, and compounds that are liquid at elevated temperature or liquid at ambient temperatures may be used. The layer 13 must be an electrical insulator; however it may be a thermal conductor. Different fillers may be added to enhance the thermal conduction, stiffness or adhesion properties of layer 13. Note that the thicknesses of the dies 15 and 17 vary. Dies made by different vendors and dies having different functions will have varying thicknesses. This is not a problem for the embodiments of this application, as the use of the temporary carrier 61 and adhesive layer 63 insure that for the bond pad sides of the dies 15 and 17 in FIG. 3, the die surfaces are coplanar, which will provide advantages in the solder bumping processes and in providing uniform underfill flow used in later steps, which are described below.

Figure 4:
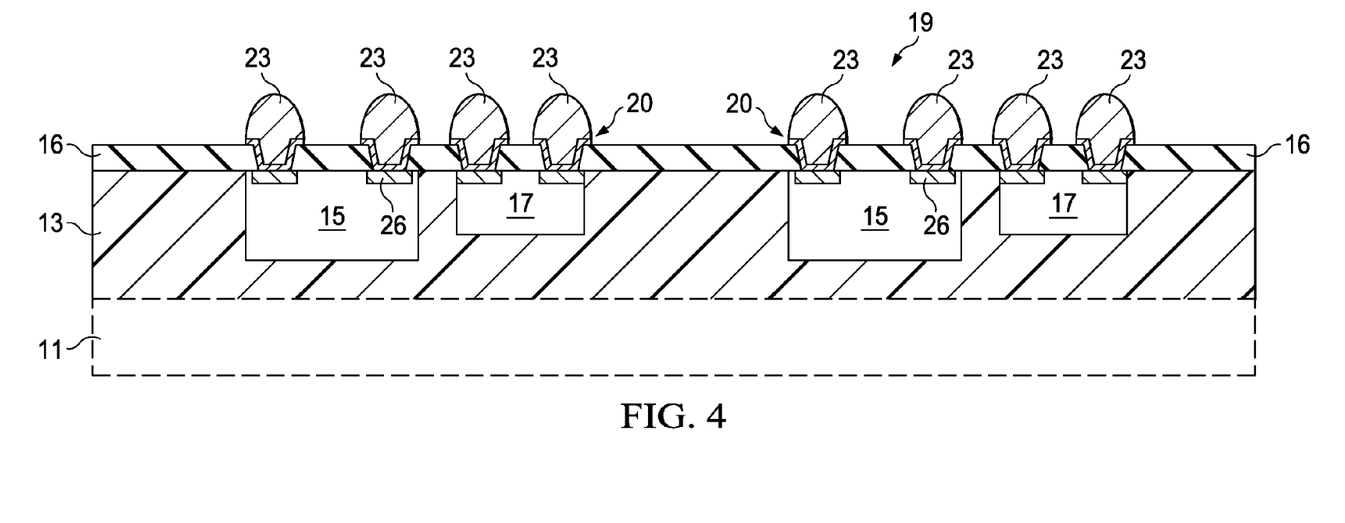
FIG. 4 depicts in a cross-sectional view the assembly of FIG. 3 following additional processing steps.

FIG. 4 depicts in a cross sectional view the completed molded chip structure 19, which is now turned over from FIG. 3 so the bond pads 26 of dies 15 and 17 face upwards in the figure. In transitioning from the structure in FIG. 3 to the structure in FIG. 4, the temporary carrier 61 is removed, and the adhesive layer 63 is removed, exposing the bond pads and the bond pad surface of the dies 15 and 17. A passivation or dielectric layer 16 is then disposed onto the exposed surface of the mold compound 13 and the bond pad side of the dies 15 and 17, which are coplanar. Openings are formed in layer 16, for example using photolithographic processes, and exposing the bond pads 26 of the dies 15 and 17. A UBM layer is deposited on and patterned to form the UBM structures 20. Materials that are useful in UBM layers provide additional adhesion to the bond pads and increase solderability, the materials may include titanium and copper, for example. The UBM layer may be formed of multiple layers, for example a first layer that adheres well to the bond pads, which may be formed of aluminum or copper or other conductive metals, and a second layer that adheres well to the solder bumps. Solder bumps 23 are disposed on the UBM 20 for each exposed bond pad 26. Solder bumps may be provided in several ways, for example using solder paste in a screen printing operation, decal transfers, or using electroless or electroplating approaches. The solder bumps may be lead based such as lead-tin (Pb/Sn) compounds or lead free eutectics comprising tin, copper, silver, (Sn Ag Cu solder bumps may be used and are sometimes called "SAC" bumps), nickel, gold, and other lead free materials. The materials form a eutectic with a common melting point which allows the materials to be heated and cooled, that is, it is compatible with solder processes including thermal reflow processing. To form the bumps on the UBM layer, a seed layer may be sputtered over the UBM in the passivation layer openings, and then photoresist and plating processes may be used over the seed layer to form bumps in a photoresist layer that is deposited and patterned to define columnar openings over the bond pads. After the plating process, the photoresist is then removed and a thermal reflow process is performed to shape the columnar solder material into solder bumps 23. Other assembly methods such as decal transfer, pick and place, paste screening, may be used to deposit bumps or solder material that is then thermally reflowed into bump shapes. Materials such as electroless nickel, electroless nickel and immersion gold (ENIG), and electroless nickel, electroless palladium, immersion gold (ENEPIG) may be added to the bumps to improve adhesion and solderability of the solder bumps, for example. The bumps may be from 10-100 µms in diameter, and may be considered "micro bumps", and bump pitch may be from 20-200 µms or more.

Figure 5:
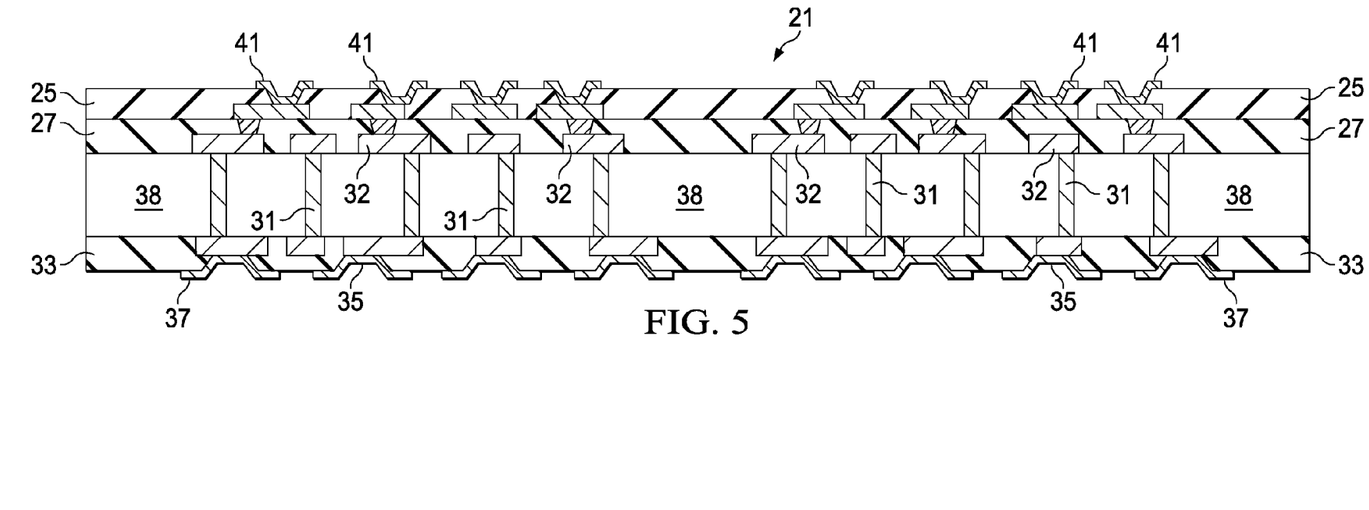
FIG. 5 depicts in a cross sectional view an interposer for use with an embodiment.

FIG. 5 depicts in a cross sectional view a silicon interposer 21 that has a die side surface (the upper surface in FIG. 5) having solder bump lands 41 arranged to receive an embodiment molded chip structure (not shown). The interposer 21 has a passivation or dielectric layer 25 that has openings formed exposing the ball land surfaces 41 of an upper redistribution layer ("RDL") 27. The upper RDL has conductors 32 arranged as horizontal and vertical portions and may remap the solder bump pattern of a particular multichip structure for an application to a standard ball grid array ("BGA") footprint. The conductors may extend vertically through the silicon or core layer 38 using vias 31 including through silicon vias ("TSVs") or other filled vias. Ball lands 35 and UBM layer 37 provide the solder ball lands for mounting the interposer to a board or system using a ball grid array ("BGA") connection technology with solder balls (not shown) disposed on lands 35.

Using an upper and sometimes a lower RDL in the interposer 21, changes in the dies used or in the solder bump pattern used for the multichip structure (not shown) to be coupled to the die side of silicon interposer 21 may be made without modifying the system board that the interposer will mount to on the opposing side. Thus system design changes are not necessary if the die vendors or die types change, or if the solder bump pattern changes. The upper RDL for the interposer can be easily changed to map the new dies or new bump pattern to the existing system board pattern. This added flexibility saves cost and allows changes in dies or die vendors to be made quickly. The lower RDL layer 33 may or may not provide an additional mapping function. If another mapping function is provided, the degrees of freedom for use of the interposer in a system board increase still further, and so the layout of the ball grid array package is more flexible.

Figure 6:
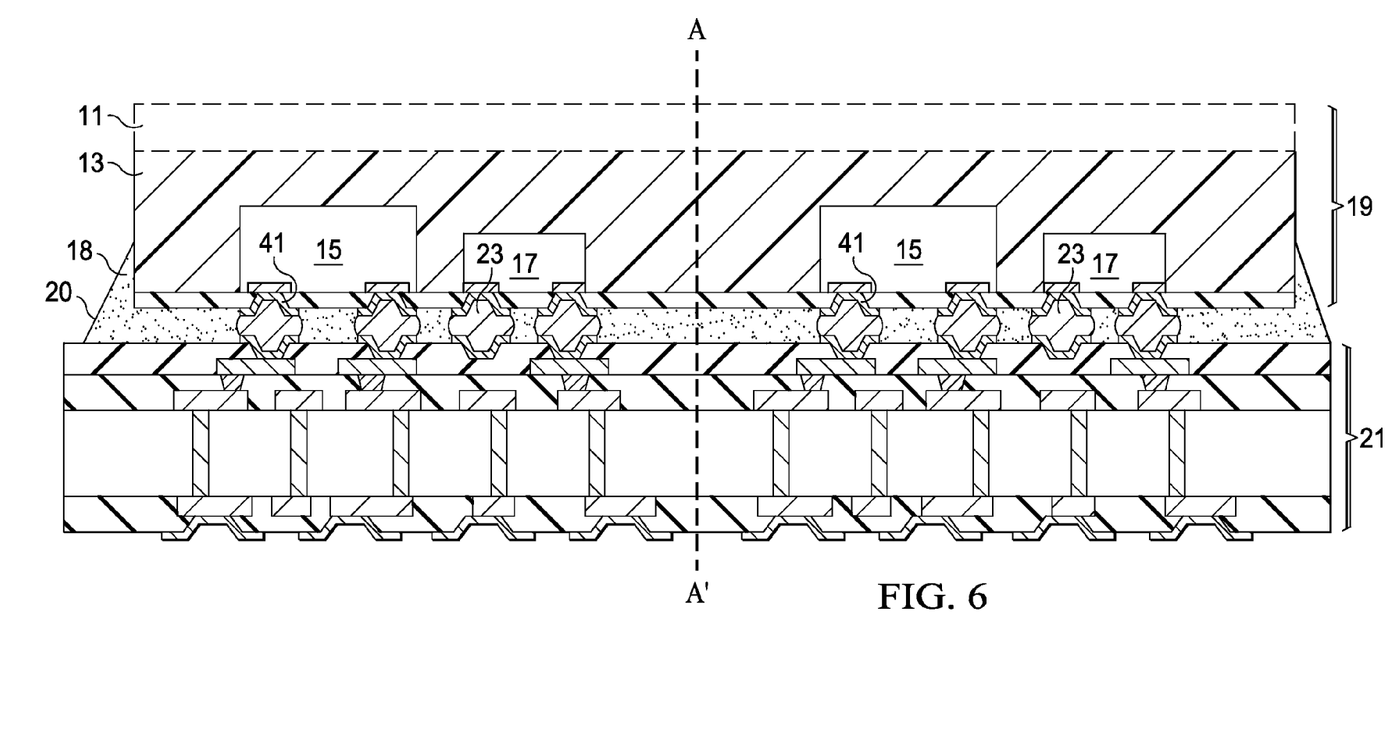
FIG. 6 depicts in a cross sectional view a completed assembly of an embodiment.

FIG. 6 is a cross sectional view of a completed molded chip interposer structure 61 of an embodiment, where a molded multichip structure 19 is mounted to an interposer 21 using the solder bumps 23, and the underfill layer 18 has been dispensed as described above to complete the structure. To form the structure of FIG. 6, the molded multichip structure 19 of FIG. 4 is placed in a proximity relationship to the die side of interposer 21 of FIG. 5 and the solder bumps 23 are placed in contact with the corresponding ball lands 41 on interposer 21. A thermal reflow process may then be used to cause the solder bumps 23 to soften and form the electrical and mechanical connections between the dies in molded multichip structure 19 and the interposer 21. After cooling these solder connections are complete. Following the interconnection thermal reflow steps, an underfill material is dispensed to form layer 18. The underfill may comprise, for example, compliant epoxies that are liquid at temperatures above room temperature, and have rapid cure times especially at elevated temperatures and low viscosity during dispensing. These may be referred to as "snap cure" epoxies. This compliant underfill layer 18 is used to provide stress relief to prevent solder bump failure due the thermal mismatch between the materials of the interposer and the dies 15, 17 and mold layer 13. As the die temperatures increase during operation, there will be uneven movement in the components. The underfill material 18 is sufficiently flexible to provide mechanical stress relief to prevent a ball cracking or die cracking failure due to thermal stresses. The underfill provides an adhesion to attach the molded chip structure 19 to interposer 21, to provide a moisture barrier and protective layer for the solder bumps 23, and importantly to provide a compliant stress relief layer for the solder bumps and dies during thermal cycling due to operation of the integrated circuit devices. The underfill may be dispensed using syringes or needles along side the molded chip structure and drawn into the gap between the interposer and the molded chip structure by capillary action. Alternative underfills include so called "no-flow" materials that are placed in areas but not flowed into them; solid underfills and reworkable underfills. These may be disposed at room temperatures or at elevated temperatures and may be cured in an oven with even higher temperatures. The advantage of a reworkable underfill is that unlike some other underfills, the structure 19 could be removed from the interposer 21 to make a change or repair, or replacement. These may be useful in prototyping or development applications.

Note that the dies 15 and 17 form a repeating pattern that is symmetrical about a line A-A' in FIG. 6. This illustrates that the process steps of the embodiments may form several identical modules simultaneously using a batch process flow. These modules may each contain for example two or more dies that have different or identical functions. After the molded structure 19 is connected to the interposer 21 and the underfill layer is dispensed to complete the structure, the individual modules may be separated by any known singulation steps along line A-A' to form identical, individual multichip modules. Alternatively the steps described above may be used to form a single completed molded interposer module device. Further the molded chip structure 19 could comprise a single integrated circuit die, or many dies. The dies may have the same size and thickness or be of varying sizes and thicknesses as shown in the embodiments described above. The illustrative embodiments provided here for explanatory purposes are not limiting and do not affect the scope of the application or the appended claims.

Figure 7:
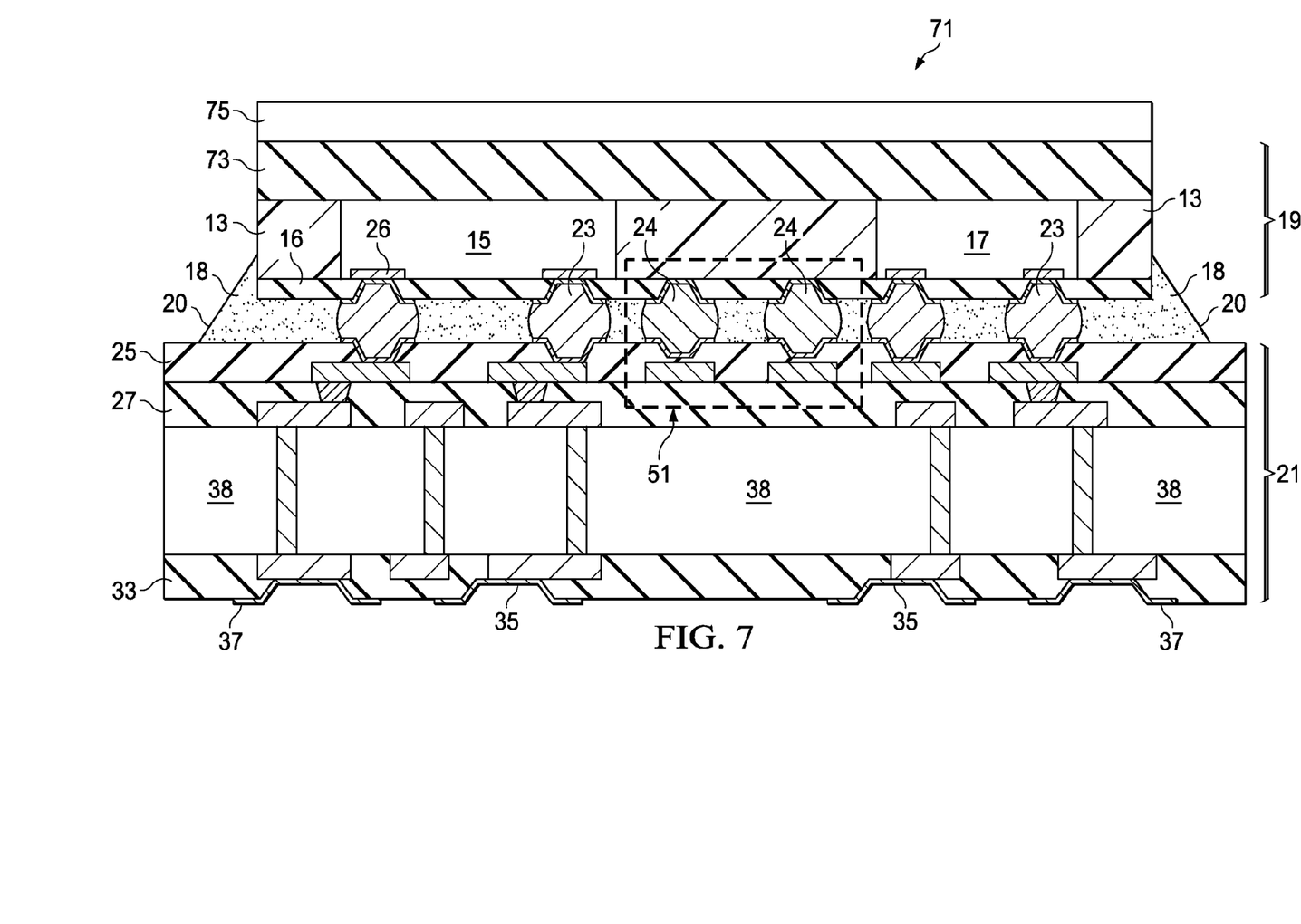
FIG. 7 depicts in a cross sectional view an assembly of an alternative embodiment.

FIG. 7 depicts in a cross sectional view an alternative embodiment molded chip interposer structure 71 with a heat sink. In FIG. 7 the molded chip structure 19 of FIG. 4 for example is further processed before mounting to the interposer 21. A portion of the mold compound layer 13 is removed, for example by a backside grinding or other mechanical operation. A planar top surface exposing the top surface (that surface opposing the bond pad surface) of the dies 15, 17 is provided and a thermal interface material ("TIM") 73 is formed as a layer over the dies and the mold compound layer 13. The TIM material acts as a thermal conductor, an insulator protective layer and as an adhesive for a heat spreader 75 which may be, for example, a metal or alloy having good thermal conduction. The use of the heat spreader 75 and the TIM layer 73 may greatly improve the thermal performance of the packaged device, lowering the ambient temperatures of the dies 15, 17 during operations, and thus increasing reliability and lowering thermal stress effects. In FIG. 7, the embodiment 71 also incorporates the optional dummy bump structure 51 to increase the uniformity of the solder bump distribution, and improve the underfill uniformity in underfill layer 18.

In one embodiment, an apparatus comprises a molded chip structure having: at least two integrated circuit dies each with bond pads on a bottom surface for receiving input output connections and each having sides and a top surface; a mold compound layer overlying the at least two integrated circuit dies and covering the sides and the top surfaces, the bottom surface of the at least two integrated circuit dies and the bottom surface of the mold compound layer being coplanar; a dielectric layer disposed covering the bottom surface of the mold compound layer and the bottom surface of the at least two integrated circuit dies; openings formed in the dielectric layer corresponding to the bond pads of the at least two integrated circuit dies; and solder bumps disposed within the openings in the dielectric layer and forming mechanical and electrical connectors to the bond pads of the at least two integrated circuit dies.

In another embodiment, an apparatus, comprises a molded chip structure having at least two integrated circuit dies disposed within a mold compound, the mold compound covering the top surface and the sides of the integrated circuit dies, the mold compound having a top surface and having a bottom surface that is coplanar with the bottom surfaces of the at least two integrated circuit dies, the at least two integrated circuit dies having bond pads on the bottom surfaces; a dielectric layer disposed on the bottom surface of the mold compound layer and the bottom surfaces of the at least two integrated circuit dies; openings formed in the dielectric layer corresponding to the bond pads of the at least two integrated circuit dies; solder bumps formed in the openings of the dielectric layer and forming connections to the bond pads of the at least two integrated circuit dies. An interposer having a die side surface and a board side surface is provided having bump lands receiving the solder bumps of the molded chip structure on the die side of the interposer, the bump lands disposed in openings in a dielectric layer overlying conductors arranged to form a redistribution layer. An underfill layer is formed between the die side of the interposer and the bottom surface of the molded chip structure and surrounding the solder bumps.

A method embodiment comprises disposing at least two integrated circuits on an adhesive layer over a temporary carrier, the integrated circuits having bond pads on one surface, the bond pads being disposed on the adhesive layer; forming a mold compound overlying the at least two integrated circuits and covering the sides and a top surface of each of the at least two integrated circuits; removing the temporary carrier and the adhesive, the bond pad surface of the at least two integrated circuits being coplanar with a bottom surface of the mold compound; and forming solder bumps connected to the bond pads of the at least two integrated circuits. In an additional method, the above steps are performed and further positioning the solder bumps in alignment with the die side surface of an interposer having a plurality of bump lands arranged in a pattern corresponding to the solder bumps; moving the solder bumps into contact with the bump lands; performing a thermal reflow to cause the solder bumps to form physical and electrical connections to the bump lands on the interposer; and dispensing an underfill material beneath the mold compound and over the die side of the interposer, the underfill filling the space between the bottom surface of the mold compound and the die side surface of the interposer, and surrounding the solder bumps.

Although exemplary embodiments and their advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
   a molded chip structure comprising:
      at least two integrated circuit dies formed in a mold compound layer, a bottom surface of the at least two integrated circuit dies and a bottom surface of the mold compound layer being coplanar;
      an interposer disposed underlying and bonding to the molded chip structure through solder bumps; and
      an underfill material formed between the interposer and the bottom surfaces of the molded chip structure and surrounding the solder bumps.

2. The apparatus of claim 1, further comprising a dummy solder bump disposed underneath the mold compound layer and positioned between the at least two integrated circuit dies.

3. The apparatus of claim 1, further comprising a support layer overlying the top surface of the mold compound layer.

4. The apparatus of claim 1, wherein one of the at least two integrated circuit dies has a first vertical thickness and another one of the at least two integrated circuit dies has a second vertical thickness different from the first vertical thickness.

5. The apparatus of claim 1, wherein the mold compound layer is free from underfill material.

6. An apparatus, comprising:
   a molded chip structure comprising:
      at least two integrated circuit dies disposed within a mold compound, the mold compound having a bottom surface that is coplanar with a bottom surface of each of the at least two integrated circuit dies, the at least two integrated circuit dies having bond pads on the bottom surfaces;

a dielectric layer disposed on the bottom surface of the mold compound layer and the bottom surfaces of the at least two integrated circuit dies;

openings formed in the dielectric layer corresponding to the bond pads of the at least two integrated circuit dies;

solder bumps formed in the openings of the dielectric layer, electrically connecting the bond pads of the at least two integrated circuit dies;

an interposer having bump lands receiving the solder bumps of the molded chip structure and;

an underfill layer formed between the interposer and the bottom surface of the molded chip structure and surrounding the solder bumps.

7. The apparatus of claim 6, wherein the at least two integrated circuit dies have the same vertical thickness.

8. The apparatus of claim 6, wherein the at least two integrated circuit dies have differing vertical thicknesses.

9. The apparatus of claim 6, wherein the molded chip structure further comprises:

an upper surface of the mold compound and the upper surface of the at least two integrated circuit dies being coplanar with one another;

a thermal interface material overlying the upper surface; and a heat sink disposed on the thermal interface material.

10. The apparatus of claim 6, and further comprising:

at least one dummy solder bump disposed between the bottom surface of the molded chip structure and the interposer, and placed between the at least two integrated circuits.

11. The apparatus of claim 6, comprising a support structure overlying the mold compound.

12. The apparatus of claim 6, wherein the mold compound layer is free from underfill material.

13. A method, comprising:

disposing at least two integrated circuits over a temporary carrier, the integrated circuits having bond pads on the bottom surface;

forming a mold compound overlying the at least two integrated circuits and covering the sides and a top surface of each of the at least two integrated circuits;

removing the temporary carrier, the bottom surface of the at least two integrated circuits being coplanar with a bottom surface of the mold compound; and forming solder bumps connected to the bond pads of the at least two integrated circuits.

14. The method of claim 13, further comprising:

forming an interposer having a plurality of bump lands arranged in a pattern corresponding to the solder bumps;

forming physical and electrical connections between the solder bumps and the bump lands on the interposer; and dispensing an underfill material filling the space between the bottom surface of the mold compound and the interposer, and surrounding the solder bumps.

15. The method of claim 13, further comprising:

removing a portion of the upper part of the mold compound and the upper part of the at least two integrated circuit dies to form a coplanar upper surface that exposes a portion of the at least two integrated circuit dies; and mounting a heat sink over the upper surface.

16. The method of claim 13 and further comprising:

forming at least one dummy solder bump disposed beneath the bottom surface of the mold compound and placed between the solder bumps of the at least two integrated circuits.

17. The method of claim 13 wherein the at least two integrated circuits have varying thicknesses.

* * * * *